(12) United States Patent
Venturini et al.

(10) Patent No.: US 7,567,158 B2
(45) Date of Patent: Jul. 28, 2009

(54) SUPERCONDUCTING MAGNET ARRANGEMENT WITH HYSTERESIS FREE FIELD COIL

(75) Inventors: Francesca Venturini, Duebendorf (CH); Robert Schauwecker, Zurich (CH); Pierre-Alain Bovier, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 12/149,639

(22) Filed: May 6, 2008

(65) Prior Publication Data

US 2009/0002107 A1 Jan. 1, 2009

(30) Foreign Application Priority Data

May 8, 2007 (DE) .................. 10 2007 021 463

(51) Int. Cl.
*H01F 6/00* (2006.01)
(52) U.S. Cl. .................. 335/216; 335/301; 324/319; 324/320; 361/141
(58) Field of Classification Search .................. 335/216, 335/301; 324/318–320; 361/19, 141, 143
See application file for complete search history.

(56) References Cited

U.S. PATENT DOCUMENTS

| | | | | |
|---|---|---|---|---|
| 6,265,960 | B1 * | 7/2001 | Schauwecker et al. | 335/301 |
| 6,476,700 | B2 * | 11/2002 | Schauwecker et al. | 335/216 |
| 6,496,091 | B2 * | 12/2002 | Schauwecker et al. | 335/216 |
| 6,563,316 | B2 * | 5/2003 | Schauwecker et al. | 324/318 |
| 6,670,878 | B2 * | 12/2003 | Schauwecker et al. | 335/299 |
| 6,680,662 | B2 * | 1/2004 | Schauwecker et al. | 335/216 |
| 6,700,469 | B2 * | 3/2004 | Amann et al. | 335/301 |
| 6,781,494 | B2 * | 8/2004 | Schauwecker et al. | 335/299 |

(Continued)

OTHER PUBLICATIONS

M.J. Nilges et al. "Electron Paramagnetic Resonance W-band Spectrometer with a Low-Noise Amplifier". Appl. Mag. Reson, 16, 167-183 (1999).

(Continued)

*Primary Examiner*—Ramon M Barrera
(74) *Attorney, Agent, or Firm*—Paul Vincent

(57) ABSTRACT

A magnet arrangement (M, M', M", M'") for generating a magnetic field in the direction of a z-axis in a working volume (V) disposed on the z-axis about z=0, with a magnet coil system (A, A', A", A'") which comprises one or more superconducting magnet partial coil systems (A1, A1', A1", A1'", A2'", . . ., An'"), each forming superconductingly short-circuited current paths in the operating state, and with a further coil system (C, C', C", C'") which can be charged or discharged independently of the magnet coil system (A, A', A", A'") and comprises a first and a second partial coil system (C1, C2, C1' C2', C1", C2", C1'", C2'"), wherein the first partial coil system (C1, C1', C1", C1'") and the second partial coil system (C2, C2', C2", C2'") each comprise at least one coil, wherein all coils of the further coil system (C, C', C", C'") are connected in series, wherein $g_C^{\mathit{eff,diamag}} > 0.1$ mT/A, is characterized in that $g_{C1}^{\mathit{eff,diamag}} > 0.1$ mT/A, $g_{C2}^{\mathit{eff,diamag}} > 0.1$ mT/A, $$\frac{g_{C1}^{\mathit{eff,class}}}{g_{C1}^{\mathit{eff,diamag}}} \notin [0.95, 1.05], \quad \frac{g_{C2}^{\mathit{eff,class}}}{g_{C2}^{\mathit{eff,diamag}}} \notin [0.95, 1.05],$$

wherein $$\frac{g_C^{\mathit{eff,class}}}{g_C^{\mathit{eff,diamag}}} \in [0.95, 1.05].$$

A substantially linear field change can thereby be realized in the working volume in dependence on a current change in the further coil system (C, C', C", C'").

15 Claims, 4 Drawing Sheets

U.S. PATENT DOCUMENTS 7,064,550 B2 * 6/2006 Shen .................. 324/319

OTHER PUBLICATIONS

G.M. Smith et al. "Progress in High Field EPR". Royal Society of Chemistry Specialist Periodical Reports 17, (2000).

A.I. Smirnov, et al. "Cryogen-Free Superconducting Magnet System for Multifrequency EPR up to 12.1 Tesla/340 GHz". Poster Webseite Cryogenic (www.cryogenic.co.uk/media/products/cf systems/EPR pdf).

D. Schmalbein et al. "The Bruker High-Frequency EPR System". Appl. Magn. Reson. 16, 185-205 (1999).

Gullá, A.F. et al. "Novel Horizontal Bore Superconducting Solenoid Design for Quasioptical High-Field Electron Paramagnetic Resonance". Concepts in Magnetic Resonance 15, 201-207 (2002).

Fuchs, Martin R.: "A High-Field/High-Frequency Electron Paramagnetic Resonance Spectrometer (360 GHz/14T)" Dissertation; Freie Universitaet Berlin, 1999.

* cited by examiner

SUPERCONDUCTING MAGNET ARRANGEMENT WITH HYSTERESIS FREE FIELD COIL

This application claims Paris Convention priority of DE 10 2007 021 463.6 filed May 8, 2007 the complete disclosure of which is hereby incorporated by reference.

BACKGROUND OF THE INVENTION

The invention concerns a magnet arrangement for generating a magnetic field in the direction of a z-axis in a working volume disposed on the z-axis about z=0, with a magnet coil system which comprises one or more superconducting magnet partial coil systems, each forming superconductingly short-circuited current paths in the operating state, and with a further coil system which can be charged or discharged independently of the magnet coil system and comprises a first and a second partial coil system, wherein the first partial coil system and the second partial coil system each comprise at least one coil, wherein all coils of the further coil system are connected in series, wherein $g_C^{eff,diamag} > 0.1$ mT/A.

The above-mentioned variable is defined as follows:

$$g_C^{eff,diamag} = g_C - g_A^T \cdot (L_A^{diamag})^{-1} \cdot L_{C \to A}^{diamag} + g_M$$

with:

$g_C$: field per ampere current of the further coil system in the working volume without the field contributions of the magnet partial coil systems and without the field contribution of the magnetization of superconductor material in the magnet arrangement.

$$g_A^T = (g_{A1}, \ldots, g_{Aj}, \ldots g_{An}),$$

$g_{Aj}$: field per ampere current of the j-th magnet partial coil system in the working volume without the field contributions of the i-th magnet partial coil systems for i≠j and without the field contributions of the further coil system and the magnetization of superconductor material in the magnet arrangement, $L_A^{diamag}$: n×n inductance matrix of the magnet partial coil systems in case of complete diamagnetic expulsion of field changes from the superconducting material volume in the magnet arrangement.

$$L_{C \to A}^{diamag} = \begin{pmatrix} L_{C \to A1}^{diamag} \\ \vdots \\ L_{C \to An}^{diamag} \end{pmatrix},$$

$L_{C \to Ai}^{diamag}$: mutual inductance of the further coil system with the i-th magnet partial coil system in case of complete diamagnetic expulsion of field changes from the superconducting material volume in the magnet arrangement, $g_M$: field in the working volume which is due to the magnetization of superconductor material in the magnet arrangement with a current change of one ampere in the further coil system in case of complete diamagnetic expulsion of field changes from the superconducting material volume in the magnet arrangement and taking into consideration the induced currents in the magnet partial coil systems.

A magnet arrangement of this type is already disclosed in [1].

In superconducting magnet arrangement applications, e.g. in the field of electron spin resonance (EPR/ESR), the magnetic field must preferably be linearly changed with time ("sweeping"). This is also called a field ramp.

In order to obtain a high resolution with such a sweep process, a further coil system (also called field coil or "sweep coil") must be used in addition to the superconducting magnet coil system, which produces a strong background field [1]. Sweeping with a further coil system instead of the superconducting magnet coil system itself is advantageous, in particular, since the heat input into the superconducting magnet coil system can be reduced because of the smaller currents that are used during sweeping with the further coil system [2]. The further coil system may thereby be normally conducting (e.g. a copper coil cooled with water) or be superconducting.

One example of a superconducting further coil system is provided in the commercial magnet system "cryogen-free superconducting ESR 12 T magnet system" by Cryogenic [3].

[4] describes a magnet arrangement with an additional current-carrying coil system with $$\frac{g_C^{eff,class}}{g_C^{eff,diamag}} > 1.2,$$

wherein $$g_C^{eff,class} = g_C - g_A^T \cdot (L_A^{class})^{-1} \cdot L_{C \to A}^{class},$$

$L_A^{class}$: n×n inductance matrix of the magnet partial coil systems, thereby neglecting any diamagnetic expulsion of fields from the superconducting material in the magnet arrangement, $$L_{C \to A}^{class} = \begin{pmatrix} L_{C \to A1}^{class} \\ \vdots \\ L_{C \to An}^{class} \end{pmatrix},$$

$L_{C \to Ai}^{class}$: inductance of the further coil system with the i-th magnet partial coil system, thereby neglecting any diamagnetic expulsion of fields from the superconducting material in the magnet arrangement.

Non-linear effects with respect to the field strength can occur in case of current changes in superconducting magnets [5]. This is generally called hysteresis. This means that the magnet produces a field which depends on the history of the current in the magnet [3, 6, 7]. The mechanism in a magnet arrangement with a superconducting magnet coil system, which produces a hysteresis during a field ramp with a further coil system, is as follows: During charging of the further coil system, a field is normally also generated in the volume of the superconducting magnet coil system. This field change is initially expelled by the superconductor material, whereby the effective field strength per ampere of the further coil system $g_C^{eff,diamag}$ can be increased or weakened compared to the value $g_C^{eff,class}$ which would be obtained without field expulsion by the superconductor material. The field expulsion of the superconductor material in case of field changes due to charging of the further coil system decreases above a certain field changing amplitude. In this regime, the field strength of the further coil system per ampere current change varies from $g_C^{eff,diamag}$ to $g_C^{eff,class}$. When the charging direction of the further coil system is changed, the field strength per ampere current change is initially again $g_C^{eff,diamag}$. The dependence of the field strength of the further coil system on the current is thus non-linear, with hysteresis.

Inductive coupling of the further coil system to the magnet coil system may moreover also be problematic and is sometimes interpreted as the source of the hysteresis [1].

Magnetic field changes also generate eddy currents (e.g. in the coil bodies). The problem is known from MRI (in particular with gradient coils). The field changes during sweeping of e.g. EPR systems are normally slower (typically from 1 G/s to 50 G/s [1]) than the field changes of the gradient coils in MRI, and the eddy currents are therefore weaker. The expected result is nevertheless a time delay of the field in the magnet center [8].

Literature describes the following methods in order to perform measurements during a sweep, despite hysteresis:

In the method presented in [6], the magnetic field is measured during a sweep (e.g. with a Hall probe) and the current is directly adjusted. One problem thereby is that the field is not exactly measured at the position of the sample. During sweeping, the field measurement is influenced by the inhomogeneity of the field of the further coil system.

The magnet is often calibrated (measurement of the magnetic field in dependence on the current B(I) with a known sample) [1, 6, 7]. The hysteresis depends, however, on the sweep amplitude and on the sweep rate [5]. This method is therefore only practical when only one sweep amplitude and one sweep rate are used.

Another alternative is to operate the magnet arrangement in the "driven mode". The magnet coil system is thereby not made persistent with a switch, but the field is kept constant by the power supply unit [3]. This method requires an additional power supply unit which must be very stable. Moreover, a high cooling liquid loss must be accepted due to the current that must constantly flow in the feed line.

One possibility for reducing the hysteresis is the use of a field coil that generates very small field strengths. In this case, the field-current curve of the further coil system shows the initial slope $g_C^{eff,diamag}$ over the entire sweep range and never enters the "classical" regime.

Field coils with a small "sweep" range are disclosed in AC applications under the name modulation coils. Such modulation coils change the field with high frequency (kilohertz range) in a harmonic fashion but only within a small range. The coverage of a large sweep range is not possible with such modulation coils.

In contrast thereto, it is the object of the present invention to propose a magnet arrangement, wherein the field change in the working volume is preferably a linear function of the current change in the further coil system which can be charged or discharged independently of the magnet coil system.

SUMMARY OF THE INVENTION

This object is achieved in accordance with the invention in that $$g_{C1}^{eff,diamag} > 0.1 mT/A, \ g_{C2}^{eff,diamag} > 0.1 mT/A,$$

$$\frac{g_{C1}^{eff,class}}{g_{C1}^{eff,diamag}} \notin [0.95, 1.05], \ \frac{g_{C2}^{eff,class}}{g_{C2}^{eff,diamag}} \notin [0.95, 1.05],$$

wherein

-continued $$\frac{g_C^{eff,class}}{g_C^{eff,diamag}} \in [0.95, 1.05],$$

The field contribution per ampere current of the further coil system in the working volume, thereby taking into consideration the field contributions of the further coil system itself and also of the field change due to currents which are induced into the magnet partial coil system during charging or discharging of the further coil system, thereby neglecting any diamagnetic expulsion of fields from the superconducting volume of the magnet arrangement, and the field contribution per ampere current of the further coil system in the working volume, thereby taking into consideration the field contributions of the further coil system itself and also of the field change due to currents which are induced in the magnet partial coil systems during charging of the further coil system, thereby taking into consideration a complete diamagnetic expulsion of fields from the superconducting volume of the magnet arrangement and of the field contribution by the magnetization change of the superconducting volume of the magnet arrangement, differ in the inventive magnet arrangement by at most 5%, $$\left(i.e. \ \frac{g_C^{eff,class}}{g_C^{eff,diamag}} \in [0.95, 1.05]\right).$$

In accordance with the invention, the entire further coil system and also both partial coil systems produce a certain field strength $g_C^{eff,diamag} > 0.1$ mT/A, $g_{C1}^{eff,diamag} > 0.1$ mT/A, $g_{C2}^{eff,diamag} > 0.1$ mT/A), wherein the partial coil systems alone have a hysteresis $$\left(i.e. \ \frac{g_{C1}^{eff,class}}{g_{C1}^{eff,diamag}} \notin [0.95, 1.05], \ \frac{g_{C2}^{eff,class}}{g_{C2}^{eff,diamag}} \notin [0.95, 1.05]\right).$$

Non-vanishing hysteresis effects of the individual partial coil systems are compensated for within the further coil system. Calibration and corrections therefore become superfluous. The second partial coil system is not a modulation coil system but a further coil system that is responsible for the generation of the field and also for the field change (sweeping) together with the first partial coil system. The field change realized in this fashion is slow and largely linear compared to the field changes caused by modulation coils. By avoiding hysteresis in the coil system, the inventive magnet arrangement can cover large sweep ranges.

In one particularly preferred embodiment of the inventive device $g_{C1}^{eff,diamag}$ and $g_{C2}^{eff,diamag}$ are constructively superposed in the working volume, wherein $$\frac{g_{C1}^{eff,class}}{g_{C1}^{eff,diamag}} > 1.05 \ \text{and} \ \frac{g_{C2}^{eff,class}}{g_{C2}^{eff,diamag}} < 0.95.$$

This improves the field efficiency of the further coil system in the working volume.

In an alternative embodiment, $g_{C1}^{eff,diamag}$ and $g_{C2}^{eff,diamag}$ are destructively superposed in the working volume and $$\frac{g_{C2}^{e\!f\!f,class}}{g_{C2}^{e\!f\!f,diamag}} \geq \frac{g_{C1}^{e\!f\!f,class}}{g_{C1}^{e\!f\!f,diamag}} > 1.05 \text{ or } \frac{g_{C2}^{e\!f\!f,class}}{g_{C2}^{e\!f\!f,diamag}} \leq \frac{g_{C1}^{e\!f\!f,class}}{g_{C1}^{e\!f\!f,diamag}} < 0.95.$$

This provides higher flexibility in the design of the further coil system.

The inventive device is particularly advantageous when the following applies for at least one $i \in \{1, \ldots, n\}$ $|L_{C \to Ai}^{class}| < 0.01 \sqrt{L_{A,ii}^{class} \cdot L_C^{class}}$, wherein the mentioned values have the following meaning: $L_{A,ii}^{class}$: matrix element in the i-th row and i-th column of the matrix $L_A^{class}$, $L_C^{class}$: overall inductance of the further coil system thereby neglecting any diamagnetic expulsion of fields from the superconductor material in the magnet arrangement. The field which is generated by the further coil system can be varied in such a device without inducing current changes into the i-th current path of the magnet coil system.

In one particularly advantageous embodiment of the inventive device, at least one coil of the first partial coil system and one coil of the second partial coil system are wound onto two different radii. The flexibility of the design of the further coil system is then particularly large.

In a further advantageous embodiment of the inventive device, at least one coil of the first partial coil system and one coil of the second partial coil system have different polarities. In this embodiment, the further coil system can be dimensioned in a particularly efficient fashion.

In one particularly preferred embodiment of the inventive magnet arrangement, the magnet coil system comprises active shielding. This provides optimum suppression of the stray field of the magnet coil system. Due to the large technical importance of actively shielded magnets, it is highly advantageous that the further coil system of such magnets can also be dimensioned such that it becomes hysteresis-free.

The inventive device is particularly advantageous when the further coil system generates a field in the working volume, which increases its inhomogeneity by a factor of maximally 2 when superposed with the field of the magnet coil system. Thus, the homogeneity of the overall magnetic field in the working volume, which is generated by the magnet coil system and the further coil system, is only minimally influenced when the current is introduced into the further coil system.

The further coil system or the magnet partial coil systems advantageously comprise coil bodies which consist of a material with a resistivity>1 E-9 ohm m at the operating temperature of the magnet arrangement. When the magnetic field changes, eddy currents are generated in the coil body. When the coil body consists of a material having high resistivity, these currents are small and only have a minimum influence on the field in the working volume.

In one particularly advantageous embodiment of the inventive magnet arrangement, the first partial coil system or the second partial coil system comprises at least one coil which is normally conducting. This arrangement is advantageous in that the normally conducting coil can be mounted in the room temperature area of the magnet coil system and thus does not influence cooling of the superconducting part of the magnet arrangement. Normally conducting materials are moreover less expensive than superconducting materials. Since superconducting coils can generate larger fields than normally conducting coils, it may also be advantageous for the first partial coil system or the second partial coil system to comprise at least one coil that is superconducting.

In a further development of this embodiment, the magnet coil system and the further coil system are disposed in a common container, wherein the container is filled with cooling liquid and/or a device for active cooling of the container is provided. This is the simplest embodiment for a magnet coil system and a further coil system which must be kept at a low temperature due to their superconducting properties.

Alternatively, the magnet coil system and the further coil system may advantageously be disposed in different containers, wherein the containers are filled with cooling liquids, and/or a device for active cooling of the containers is provided. An arrangement of this type is advantageous in that different temperatures and cooling powers can be used for the two containers.

The inventive magnet arrangement is preferably used as part of an apparatus for electron paramagnetic resonance (EPR) or for nuclear magnetic resonance (NMR) applications. The advantages of the inventive magnet arrangement are particularly effective in EPR, since a large sweep range is advantageous.

In the inventive magnet arrangement, the hysteresis effects of a classically designed first partial coil system are compensated for by the interaction with a second partial coil system. The lack of hysteresis therefore plays a minor role in the design of the first partial coil system. Therefore the inventive magnet arrangement provides a solution for the long-standing hysteresis problem.

The invention also concerns a method for operating the inventive magnet arrangement, wherein at least one of the magnet partial coil system generates a magnetic field of at least 1 T in the working volume, and wherein the overall magnetic field in the working volume, which is generated by the magnet partial coil systems and the further coil systems, is varied by changing the current that flows in the further coil system.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

The invention is illustrated in the drawing and explained in more detail with reference to embodiments.

DESCRIPTION OF THE PREFERRED EMBODIMENT

Figure 1:
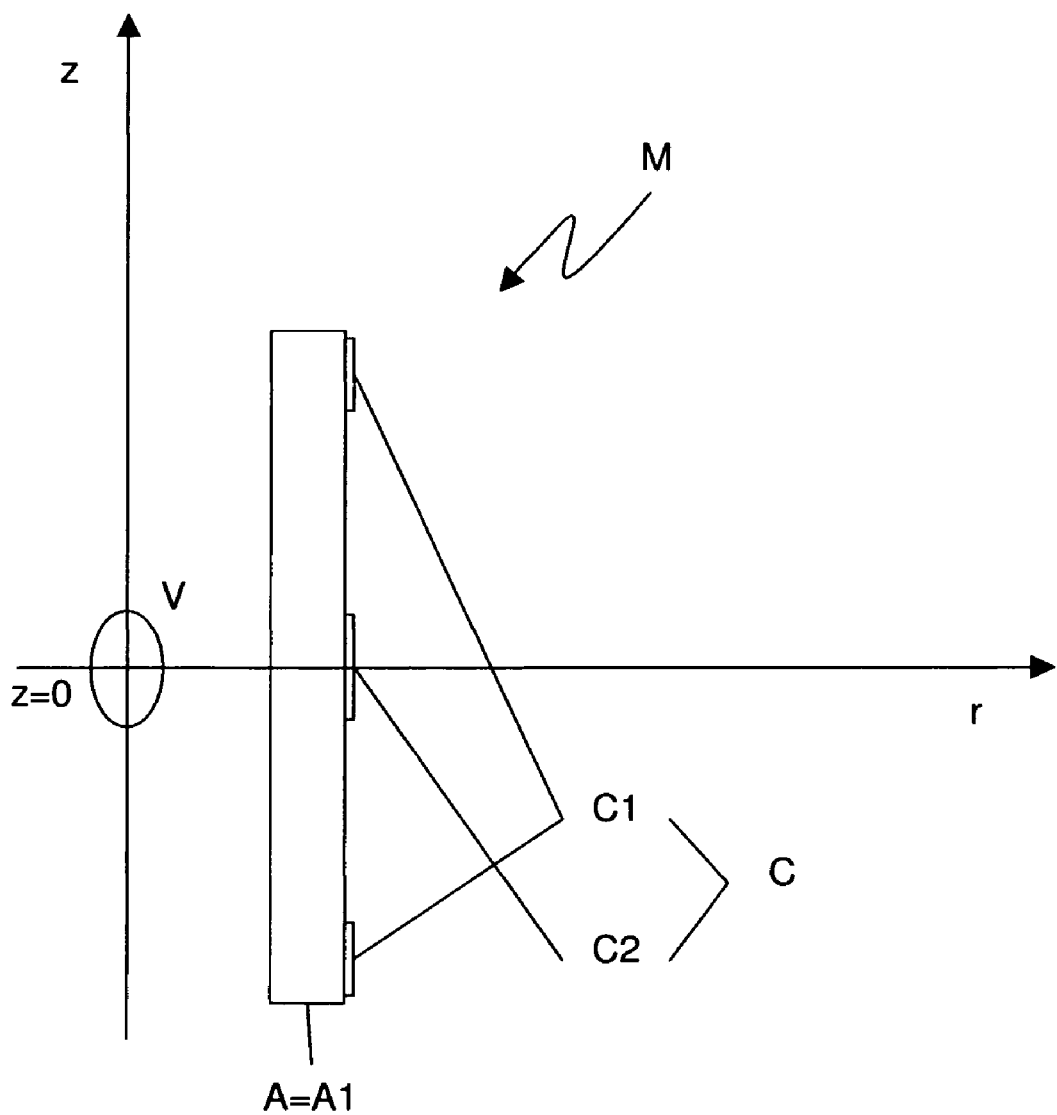
FIG. 1 shows a schematic vertical section through a radial half of an embodiment of the inventive magnet arrangement.

FIG. 1 shows a first embodiment of an inventive magnet arrangement M with a magnet coil system A and a further coil system C around a working volume V. The magnet coil system A of this embodiment comprises a magnet partial coil system A1 with only one coil. The further coil system C comprises a first partial coil system C1 with two coils and a second partial coil system C2 with one coil, wherein the partial coil systems C1, C2 are wound onto the coil of the magnet coil system A. In order to ensure that the further coil system C is hysteresis-free and decoupled from the magnet coil system A, the two coils of the first partial coil system C1 have opposite polarities with respect to the coil of the second partial coil system C2.

Figure 2:
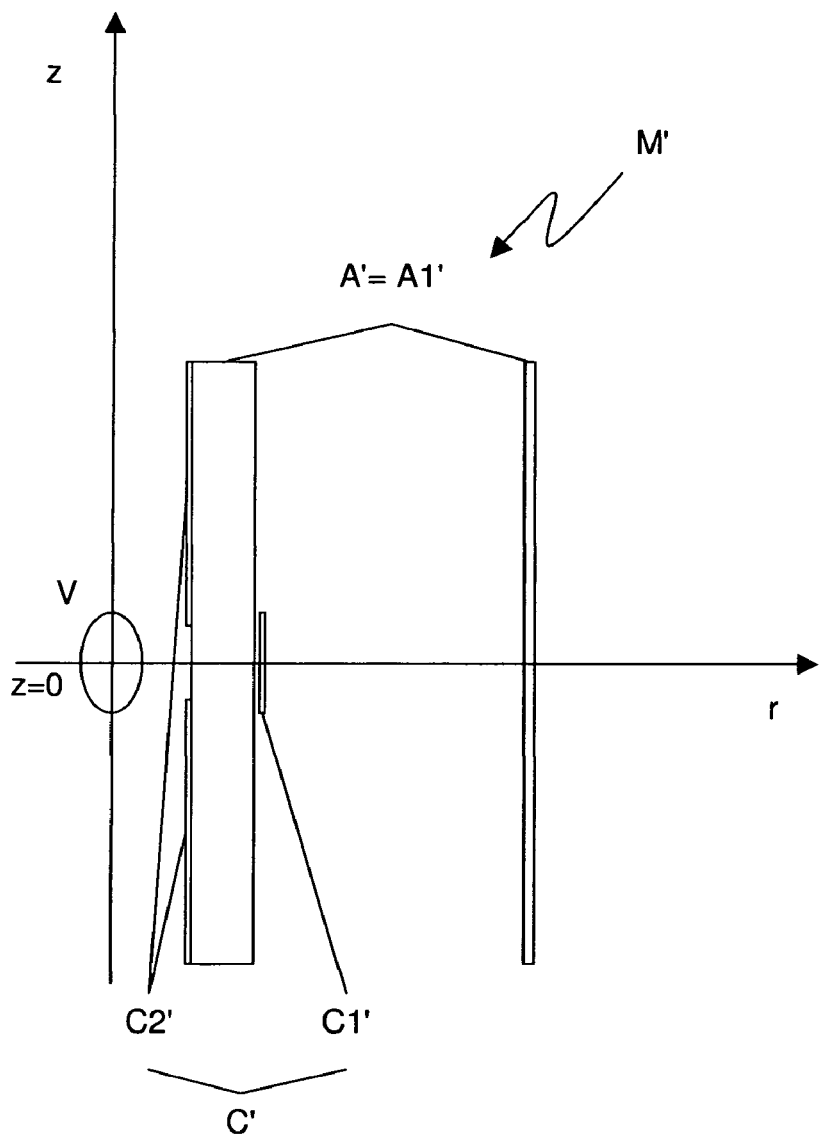
FIG. 2 shows a schematic vertical section through a radial half of a further embodiment of the inventive magnet arrangement.

FIG. 2 shows a further embodiment of an inventive magnet coil arrangement M'. A magnet coil system A' comprises a magnet partial coil system A1' and is actively shielded. The two coils of the magnet partial coil system A1' have opposite polarities. A further coil system C' comprises a first and a second partial coil system C1', C2', wherein the first partial coil system C1' comprises one coil and the second partial coil system C2' comprises two coils. The coil of the first partial coil system C1' and the coils of the second partial coil system C2' are wound onto two different radii. All coils of the further coil system C' have the same polarity.

Figure 3:
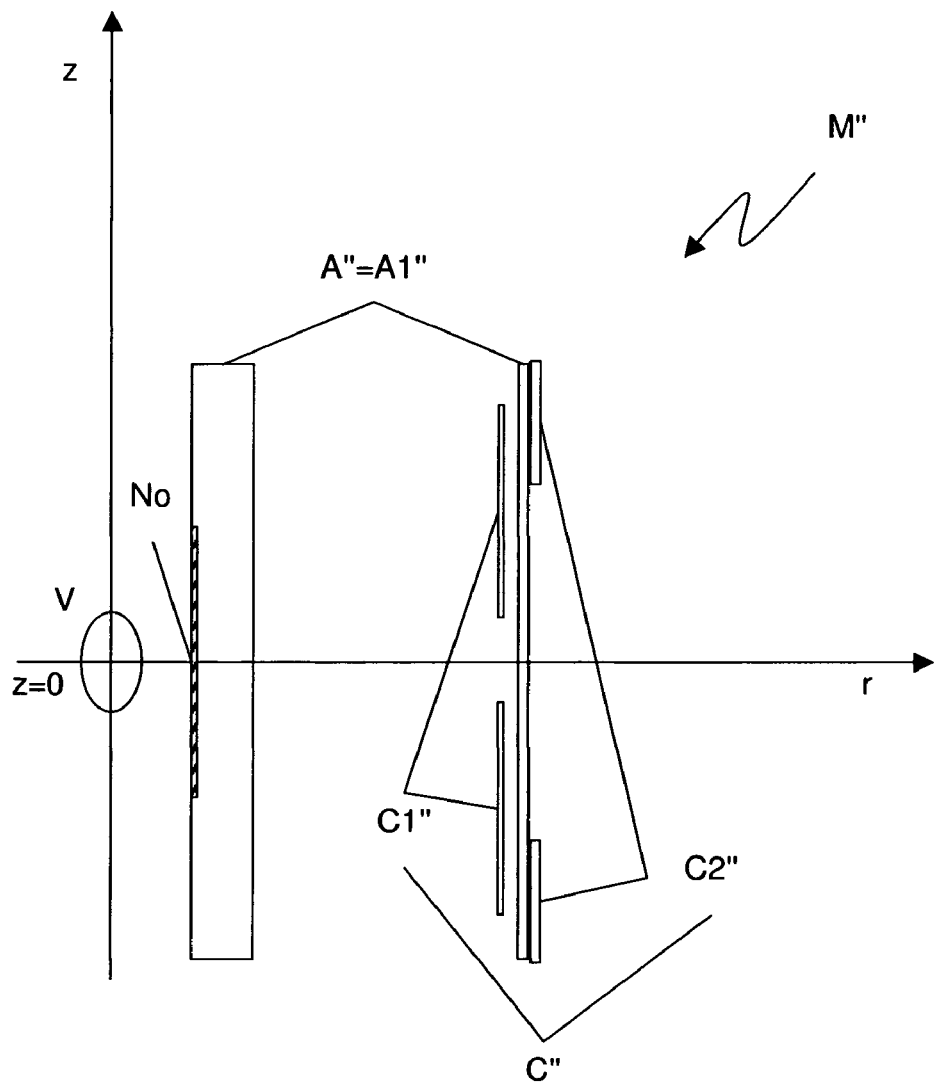
FIG. 3 shows a schematic vertical section through a radial half of a further embodiment of the inventive magnet arrangement.

FIG. 3 shows a further embodiment of an inventive magnet arrangement M''. This magnet coil system A'' is also actively shielded and homogenized with a full notch No in the radially inner coil. A further coil system C'' comprises a first and a second partial coil system C1'', C2'', wherein the first partial coil system C1'' and the second partial coil system C2'' each comprise two coils. The first and the second partial coil system C1'', C2'' have different polarities.

Figure 4:
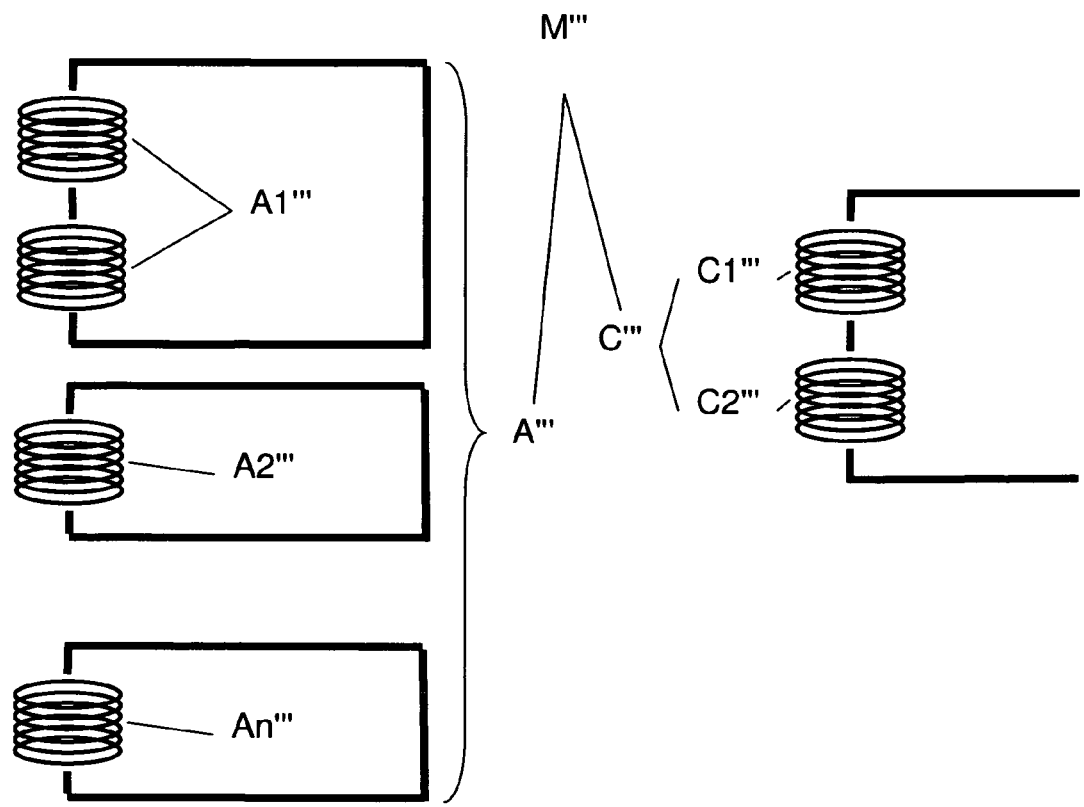
FIG. 4 shows a wiring diagram of an inventive magnet arrangement.

FIG. 4 schematically shows the wiring of an inventive magnet arrangement M'''. A magnet coil system A''' comprises n superconducting magnet partial coil systems A1''', A2''', ... An''' which each form superconductingly short-circuited current paths in the operating state. The further coil system C''' comprises a first and a second partial coil system C1''', C2''', each comprising at least one coil, and can be charged or discharged independently of the magnet coil system A'''.

Chapter 7 of [5] describes the so-called critical state of type II superconductors. Type II superconductors are typically used in the magnet coil system A, A', A'', A''', since they are particularly suited for generating high magnetic fields. These superconductors are in a critical state above the lower critical magnetic field Bc1 which is within a magnitude of 0.1 Tesla. In this state, any minor magnetic field change is expelled from the superconductor volume in that shielding currents flow on the surface of the superconductor volume. Macroscopically, the magnet coil system A, A', A'', A''' thus behaves diamagnetically, i.e. like a material with magnetic permeability which is between 0 and 1. The exact value of the magnetic permeability results from the superconductor fraction in the volume of the magnet coil system M, M', M'', M'''. With a large superconductor fraction, the magnetic permeability is in the vicinity of 0, with a small superconductor fraction, it is close to 1. The above-mentioned small magnetic field change can be generated by changing the current in the further coil system C, C', C'', C'''. For calculating the field changes in the working volume V caused by a small current change in the further coil system C, C', C'', C''', the diamagnetic property of the magnet coil system A, A', A'', A''' must be taken into consideration. The following formula must be used:

$$g_C^{eff,diamag} = g_C - g_A^T \cdot (L_A^{diamag})^{-1} \cdot L_{C \to A}^{diamag} + g_M$$

wherein the values used have the above-mentioned meanings. All values g of this formula are to be understood as the magnetic field in the working volume V per ampere current in the further coil system C, C', C'', C'''. The first term on the right-hand side would be the field of the further coil system C, C', C'', C''' in the absence of the magnet coil system A, A', A'', A'''. The second term is the field contribution through current changes in the magnet coil system A, A', A'', A'''. These current changes are produced in that the magnetic flux is kept constant by the superconducting magnet coil system A, A', A'', A''' due to the Lenz's Law. Its value is influenced by the diamagnetic behavior of the magnet coil system A, A', A'', A'''. The third term is the field contribution in the working volume V which is produced by the magnetization of the superconductor of the magnet coil system A, A', A'', A''' and the coil system C, C', C'', C'''. The overall field change in the working volume V per ampere current in the further coil system C, C', C'', C''' is thus given by $g_C^{eff,diamag}$. This applies, however, only for small current changes in the further coil system C, C', C'', C''', so that $g_C^{eff,diamag}$ means only the initial value of the field change-per-ampere curve. Above a certain current in the further coil system C, C', C'', C''', one can possibly pass into another "regime" of field change-per-ampere curve.

The larger the magnetic field change to which a superconductor is subjected, the more this magnetic field enters into the superconducting volume. When the magnetic field change is large enough, any additional magnetic field change will fully enter into the superconducting volume, such that the magnet coil system A, A', A'', A''' has a magnetic permeability of 1, which is called the classical regime. The magnetic field in the working volume V per ampere current in the further coil system C, C', C'', C''' is then calculated with the formula $$g_C^{eff,class} = g_C - g_A^T \cdot (L_A^{class})^{-1} \cdot L_{C \to A}^{class},$$

wherein all values have the same meaning as the corresponding "diamagnetic values", only with a magnetic permeability of 1 for the magnet coil system A, A', A'', A'''. The value $g_C^{eff,class}$ is to be interpreted as the final value of the field change per ampere curve of the further coil system C, C', C'', C''', i.e. as a magnetic field change per ampere current in the further coil system C, C', C'', C''', when a large magnetic field change has previously taken place.

With each sign change of the current change in the further coil system C, C', C'', C''', one falls back to the diamagnetic regime until the field change in the magnet coil system A, A', A'', A''' is sufficiently large that it can enter again into the superconducting volume. When the values $g_C^{eff,diamag}$ and $g_C^{eff,class}$ differ, the field change in the working volume V is non-linearly dependent on the current change in the further coil system C, C', C'', C''', which is usually not desired. It is the purpose of the present invention to match the values $g_C^{eff,diamag}$ and $g_C^{eff,class}$ in order to provide a preferentially linear field current dependence.

The invention is explained below with reference to the embodiments of a superconducting magnet arrangement shown in FIGS. 1 through 3, which comprise a superconducting magnet coil system A, A', A'' and a further coil system C, C', C'' for generating a magnetic field in the working volume V, wherein each further coil system C, C', C'' can be charged or discharged independently of the magnet coil system A, A', A''.

In the first embodiment shown in FIG. 1 (called "AF1" below), the magnet coil system A has only one coil. The further coil system C comprises a first and a second partial coil system C1, C2, wherein the first partial coil system C1 has two coils and the second partial coil system C2 has only one coil. All coils of the further coil system C are connected in series and disposed on the coil of the magnet coil system A. The two coils of the first partial coil system C1 and the coil of the second partial coil system C2 have opposite polarities.

$g_{C1}^{eff,diamag}$ and $g_{C2}^{eff,diamag}$ are constructively superposed in the working volume V. The following inequalities and equations apply:

$$\frac{g_{C1}^{eff,class}}{g_{C1}^{eff,diamag}} > 1.05, \quad \frac{g_{C2}^{eff,class}}{g_{C2}^{eff,diamag}} < 0.95 \text{ and } \frac{g_{C}^{eff,class}}{g_{C}^{eff,diamag}} = 0.99.$$

The magnet coil system A' of the second embodiment shown in FIG. 2 (called "AF2" below) is actively shielded and comprises two coils. The further coil system C' comprises a first and a second partial coil system C1', C2', wherein the first partial coil system C1' comprises one coil and the second partial coil system C2' comprises two coils. The coil of the first partial coil system C1' and the coils of the second partial coil system C2' are wound onto two different radii and have the same polarity. The coils of the further coil system C' are disposed in such a fashion that $g_{C1}^{eff,diamag}$ and $g_{C2}^{eff,diamag}$ are destructively superposed in the working volume V, i.e.

$$\frac{g_{C2}^{eff,class}}{g_{C2}^{eff,diamag}} \le \frac{g_{C1}^{eff,class}}{g_{C1}^{eff,diamag}} < 0.95 \text{ and } \frac{g_{C}^{eff,class}}{g_{C}^{eff,diamag}} = 0.96.$$

The magnet coil system A" of the third embodiment shown in FIG. 3 (called "AF3" below) is actively shielded like in AF2. In this embodiment, the magnet coil system A" is homogenized with a full notch No in the first coil. The first and the second partial coil system C1", C2" of the further coil system C" comprise two coils each. The coils of the first partial coil system C1" and the coils of the second partial coil system C2" are wound onto two different radii. The coils of the first partial coil system C1" and the coils of the second partial coil system C2" have opposite polarities, such that $g_{C1}^{eff,diamag}$ and $g_{C2}^{eff,diamag}$ are destructively superposed in the working volume V, i.e.

$$\frac{g_{C2}^{eff,class}}{g_{C2}^{eff,diamag}} \le \frac{g_{C1}^{eff,class}}{g_{C1}^{eff,diamag}} < 0.95$$

and the further coil system C" becomes hysteresis-free $$\left(\frac{g_{C}^{eff,class}}{g_{C}^{eff,diamag}} = 1.00\right).$$

The geometry of the coils was chosen in such a fashion that the further coil system C" generates a field in the working volume V which, when superposed with the field of the magnet coil system A", increases its inhomogeneity in a spherical volume with a diameter of 40 mm by a factor of less than 2 for +/−10 A in the further coil system C". The further coil system C" is therefore also homogeneous.

Table 1 shows the geometrical dimensions of the coils of the embodiment AF1.

TABLE 1

| | | ri [mm] | ra [mm] | L [mm] | O [mm] | N | W |
|---|---|---|---|---|---|---|---|
| A | First coil | 59.3 | 89.7 | 286.0 | 0.0 | 50 | 409.2 |
| C1 | First coil | 89.7 | 93.4 | 31.0 | 125.5 | 6 | 44.4 |
| | Second coil | 89.7 | 93.4 | 31.0 | −125.5 | 6 | 44.4 |
| C2 | First coil | 89.7 | 93.4 | 45.0 | 0.0 | 6 | −63.4 |

Table 2 shows the geometrical size of the coils of the embodiment AF2.

TABLE 2

| | AF2 | | | | | | |
|---|---|---|---|---|---|---|---|
| | | ri [mm] | ra [mm] | L [mm] | O [mm] | N | W |
| A' | First coil | 40.0 | 69.2 | 300.0 | 0.0 | 48 | 429.2 |
| | Second coil | 130.0 | 134.9 | 300.0 | 0.0 | 8 | −429.2 |
| C1' | First coil | 69.2 | 70.5 | 50.0 | 0.0 | 2 | 71.5 |
| C2' | First coil | 38.7 | 40.0 | 120.0 | 90.0 | 2 | 171.7 |
| | Second coil | 38.7 | 40.0 | 120.0 | −90.0 | 2 | 171.7 |

Table 3 shows the geometrical size of the coils of the embodiment AF3.

TABLE 3

| | AF3 | | | | | | |
|---|---|---|---|---|---|---|---|
| | | ri [mm] | ra [mm] | L [mm] | O [mm] | N | W |
| A" | First coil | 40.0 | 69.2 | 300.0 | 0.0 | 48 | 429.2 |
| | Full Notch | 40.0 | 42.5 | 137.0 | 0.0 | 4 | — |
| | Second coil | 130.0 | 134.9 | 300.0 | 0.0 | 8 | −429.2 |
| C1" | First coil | 120.0 | 122.5 | 107.0 | 74.5 | 4 | 153.1 |
| | Second coil | 120.0 | 122.5 | 107.0 | −74.5 | 4 | 153.1 |
| C2" | First coil | 135.0 | 139.9 | 62.0 | 121.5 | 8 | −88.7 |
| | Second coil | 135.0 | 139.9 | 62.0 | −121.5 | 8 | −88.7 |

The following applies for each coil:
ri: inner radius,
ra: outer radius,
L: length in the magnet axis direction z,
O: z-coordinate of the coil center,
N: number of wire layers and
W the number of windings per wire layer.
W has a sign in each case that represents the polarity, i.e. the current direction of the corresponding coil.

Table 4 shows the factors $g_A$ of the magnet coil system A, A', A" and $g_{C1}$, $g_{C2}$, $g_C$, of the first and second partial coil systems C1, C2, C1' C2', C1", C2" of the further coil system C, C', C" for the embodiments AF1, AF2, and AF3. The calculated factors $g_{C1}^{eff,diamag}$, $g_{C2}^{eff,diamag}$, $g_{C}^{eff,diamag}$, $$\frac{g_{C1}^{eff,class}}{g_{C1}^{eff,diamag}}, \frac{g_{C2}^{eff,class}}{g_{C2}^{eff,diamag}} \text{ and } \frac{g_{C}^{eff,class}}{g_{C}^{eff,diamag}}$$

of the first and second partial coil systems C1, C2, C1' C2', C1", C2" of the further coil system C, C', C" are also listed in table 4.

TABLE 4

|  | AF1 | AF2 | AF3 |
|---|---|---|---|
| $g_A$ [mT/A] | 73.14 | 70.24 | 64.08 |
| $g_{C1}$ [mT/A] | -0.76 | 1.21 | 3.99 |
| $g_{C2}$ [mT/A] | 2.54 | 1.30 | -2.77 |
| $g_C$ [mT/A] | 1.78 | 2.51 | 1.22 |
| $g_{C1}^{eff,diamag}$ [mT/A] | 0.98 | 0.68 | 3.93 |
| $g_{C2}^{eff,diamag}$ [mT/A] | 0.78 | -0.20 | -3.74 |
| $g_C^{eff,diamag}$ [mT/A] | 1.77 | 0.48 | 0.19 |
| $\dfrac{g_{C1}^{eff,class}}{g_{C1}^{eff,diamag}}$ | 1.09 | 0.92 | 0.83 |
| $\dfrac{g_{C2}^{eff,class}}{g_{C2}^{eff,diamag}}$ | 0.87 | 0.82 | 0.82 |
| $\dfrac{g_C^{eff,class}}{g_C^{eff,diamag}}$ | 0.99 | 0.96 | 1.00 |

These values can be determined e.g. by means of a Finite Element Software. For values with the index "class", air as well as the coils are associated with a magnetic permeability of 1. For values with the index "diamag", however, the coils of the magnet coil system A, A', A" were given a permeability of 0.5 in the calculation, whereas all other coils and air still had a permeability of 1. This permeability of 0.5 takes into consideration the fact that small magnetic field changes are expelled from the volume of the magnet coil system A, A', A". Since the superconductor does not cover the entire volume of the magnet coil system A, A', A", expulsion is not complete. The permeability is therefore within the interval [0,1] (=0 complete expulsion, 1=no expulsion).

The expert can derive the embodiments, which are shown as examples in the figures, and further inventive embodiments from the above-mentioned conditions for the values $g_{C1}^{eff,diamag}$, $g_{C2}^{eff,diamag}$, $g_{C1}^{eff,class}$, $g_{C2}^{eff,class}$, $g_C^{eff,diamag}$, $g_C^{eff,class}$ through the use of conventional optimization procedures in which the coil arrangements are varied until the criterion is met as the target function of the optimization process.

| List of Reference Numerals | |
|---|---|
| A, A', A", A'" | Magnet coil system |
| A1, A1', A1", A1'", A2'", An'" | Magnet partial coil systems |
| n | Number of magnet partial coil systems of the magnet coil system |
| C, C', C", C'" | Further coil system |
| C1, C1', C1", C1'" | First partial coil system |
| C2, C2', C2", C2'" | Second partial coil system |
| L | Axial length of a coil |
| M, M', M", M'" | Magnet arrangement |
| N | Number of layers of one coil |
| No | Full Notch |
| O | z-coordinate of the center of a coil |
| ri | Inner radius of a coil |
| ra | Outer radius of a coil |
| V | Working volume |
| W | Number of windings per coil layer |

LIST OF REFERENCES

[1] M. J. Nilges et al., Appl. Mag. Reson. 16, 167-183 (1999).
[2] G. M. Smith, P. C. Riedi, "Progress in high field EPR", Royal Society of Chemistry Specialist Periodical Reports 17, (2000).
[3] Poster Website Cryogenic (www.cryogenic.co.uk/media/products/cf_systems/EPR.pdf).
[4] DE10041672.
[5] M. N. Wilson, "Superconducting Magnets", Oxford University Press, New York (1983).
[6] D. Schmalbein et al., Appl. Mag. Reson. 16, 185-205 (1999).
[7] M. R. Fuchs, Diss. FU Berlin (2000).
[8] A. F. Gullá et al., Concepts in Magnetic Resonance 15, 201-207 (2002).

We claim:

1. A magnet arrangement (M, M', M", M'") for generating a magnetic field in a direction of a z-axis in a working volume (V) disposed on the z-axis about z=0, the magnet arrangement comprising:

a magnet coil system (A, A', A", A'") having one or more superconducting magnet partial coil systems (A1, A1', A1", A1'", A2'", ..., An'"), each forming superconductingly short-circuited current paths in an operating state thereof; and a further coil system (C, C', C", C'") which can be charged or discharged independently of the magnet coil system (A, A', A", A'"), said further coil system having a first and a second partial coil system (C1, C2, C1', C2', C1", C2", C1'", C2'"), wherein each of said first partial coil system (C1, C1', C1", C1'") and said second partial coil system (C2, C2', C2", C2'") has at least one coil, all coils of said further coil system (C, C', C", C'") being connected in series, wherein $g_C^{eff,diamag} > 0.1$ mT/A, $g_{C1}^{eff,diamag} > 0.1$ mT/A, $$g_{C2}^{eff,diamag} > 0.1 mT/A, \frac{g_{C1}^{eff,class}}{g_{C1}^{eff,diamag}} \notin [0.95, 1.05],$$

$$\frac{g_{C2}^{eff,class}}{g_{C2}^{eff,diamag}} \notin [0.95, 1.05], \text{ wherein}$$

$$\frac{g_C^{eff,class}}{g_C^{eff,diamag}} \in [0.95, 1.05], \text{ with}$$

$$g_C^{eff,class} = g_C - g_A^T \cdot (L_A^{class})^{-1} \cdot L_{C \to A}^{class},$$

$$g_{C1}^{eff,class} = g_{C1} - g_A^T \cdot (L_A^{class})^{-1} \cdot L_{C1 \to A}^{class},$$

$$g_{C2}^{eff,class} = g_{C2} - g_A^T \cdot (L_A^{class})^{-1} \cdot L_{C2 \to A}^{class},$$

$$g_C^{eff,diamag} = g_C - g_A^T \cdot (L_A^{diamag})^{-1} \cdot L_{C \to A}^{diamag} + g_M,$$

$$g_{C1}^{eff,diamag} = g_{C1} - g_A^T \cdot (L_A^{diamag})^{-1} \cdot L_{C1 \to A}^{diamag} + g_{M1},$$

$$g_{C2}^{eff,diamag} = g_{C2} - g_A^T \cdot (L_A^{diamag})^{-1} \cdot L_{C2 \to A}^{diamag} + g_{M2}$$

wherein:

$g_C$, $g_{C1}$, $g_{C2}$: field per ampere current of said further coil system (C, C', C", C'") or of said first or said second partial coil system (C1, C2, C1', C2', C1", C2", C1'", C2'") in the working volume (V) without field contributions of said magnet partial coil systems (A1, A1', A1", A1'", A2'", ..., An'") and without a field contribution of magnetization of superconductor material in the magnet arrangement (M, M', M", M'''), $$g_A{}^T = (g_{A1}, \ldots, g_{Aj}, \ldots, g_{An}),$$

$g_{Aj}$: field per ampere current of a j-th magnet partial coil system (Aj) in the working volume (V) without field contributions of an i-th magnet partial coil system (Ai) for i≠j and without field contributions of said further coil system (C, C', C", C''') and magnetization of superconductor material in the magnet arrangement (M, M', M", M'''), $L_A{}^{class}$: n×n inductance matrix of said magnet partial coil systems (A1, A1', A1", A1''', A2''', ..., An'''), thereby neglecting any diamagnetic expulsion of fields from superconductor material in the magnet arrangement (M, M', M", M'''), $$L_{C \to A}^{class} = \begin{pmatrix} L_{C \to A1}^{class} \\ \vdots \\ L_{C \to An}^{class} \end{pmatrix}, L_{C1 \to A}^{class} = \begin{pmatrix} L_{C1 \to A1}^{class} \\ \vdots \\ L_{C1 \to An}^{class} \end{pmatrix}, L_{C2 \to A}^{class} = \begin{pmatrix} L_{C2 \to A1}^{class} \\ \vdots \\ L_{C2 \to An}^{class} \end{pmatrix}$$

$L_{C \to Ai}^{class}, L_{C1 \to Ai}^{class}, L_{C2 \to Ai}^{class}$: mutual inductance of said further coil system (C, C', C", C''') or of said first or second partial coil system (C1, C2, C1' C2', C1", C2", C1''', C2''') with an i-th magnet partial coil system (Ai), thereby neglecting any diamagnetic expulsion of fields from superconductor material in the magnet arrangement (M, M', M", M'''), $L_A{}^{diamag}$: n×n inductance matrix of said magnet partial coil systems (A1, A1', A1", A1''', A2''', ..., An''') in case of complete diamagnetic expulsion of field changes from superconducting material volume in the magnet arrangement (M, M', M", M'''), $$L_{C \to A}^{diamag} = \begin{pmatrix} L_{C \to A1}^{diamag} \\ \vdots \\ L_{C \to An}^{diamag} \end{pmatrix}, L_{C1 \to A}^{diamag} = \begin{pmatrix} L_{C1 \to A1}^{diamag} \\ \vdots \\ L_{C1 \to An}^{diamag} \end{pmatrix}, L_{C2 \to A}^{diamag} = \begin{pmatrix} L_{C2 \to A1}^{diamag} \\ \vdots \\ L_{C2 \to An}^{diamag} \end{pmatrix}$$

$L_{C \to Ai}^{diamag}, L_{C1 \to Ai}^{diamag}, L_{C2 \to Ai}^{diamag}$: mutual inductance of said further coil system (C, C', C", C''') or of said first or second partial coil system (C1, C2, C1' C2', C1", C2", C1''', C2''') with an i-th magnet partial coil system (Ai) in case of complete diamagnetic expulsion of field changes from superconducting material volume in the magnet arrangement (M, M', M", M'''), $g_M$, $g_{M1}$, $g_{M2}$: field in the working volume (V) which is caused by magnetization of superconductor material in the magnet arrangement (M, M', M", M''') with a current change of one ampere in said further coil system (C, C', C", C''') or in said first or said second partial coil systems (C1, C2, C1' C2', C1", C2", C1''', C2''') in case of complete diamagnetic expulsion of field changes from superconducting material volume in the magnet arrangement (M, M', M", M'''), taking into consideration induced currents in said magnet partial coil systems (A1, A1', A1", A1''', A2''', ..., An'''), and n: number of said magnet partial coil systems (A1, A1', A1", A1''', A2''', ..., An''') of the magnet coil system (A, A', A", A''').

2. The magnet arrangement (M, M''') of claim 1, wherein $g_{C1}^{eff,diamag}$ and $g_{C2}^{eff,diamag}$ are constructively superposed in the working volume (V) with $$\frac{g_{C1}^{eff,class}}{g_{C1}^{eff,diamag}} > 1.05 \text{ and } \frac{g_{C2}^{eff,class}}{g_{C2}^{eff,diamag}} < 0.95.$$

3. The magnet arrangement (M', M", M''') of claim 1, characterized in that $g_{C1}^{eff,diamag}$ and $g_{C2}^{eff,diamag}$ are destructively superposed in the working volume (V) with $$\frac{g_{C2}^{eff,class}}{g_{C2}^{eff,diamag}} \geq \frac{g_{C1}^{eff,class}}{g_{C1}^{eff,diamag}} > 1.05 \text{ or}$$

$$\frac{g_{C2}^{eff,class}}{g_{C2}^{eff,diamag}} \leq \frac{g_{C1}^{eff,class}}{g_{C1}^{eff,diamag}} < 0.95.$$

4. The magnet arrangement (M, M''') of claim 1, wherein for at least one i∈{1, ..., n} the following applies:

$$|L_{C \to Ai}^{class}| < 0.01 \sqrt{L_{A,ji}^{class} \cdot L_C^{class}}$$

wherein:

$L_{A,ii}^{class}$: matrix element in an i-th line and i-th column of said matrix $L_A^{class}$, $L_C^{class}$: overall inductance of said further coil system (C, C''') thereby neglecting any diamagnetic expulsion of fields from superconductor material in the magnet arrangement (M, M''').

5. The magnet arrangement (M', M", M''') of claim 1, wherein at least one coil of said first partial coil system (C1', C1", C1''') and one coil of said second partial coil system (C2', C2", C2''') are wound on two different radii.

6. The magnet arrangement (M, M", M''') of claim 1, wherein at least one coil of said first partial coil system (C1, C1", C1''') and one coil of said second partial coil system (C2, C2", C2''') have different polarities.

7. The magnet arrangement (M', M", M''') of claim 1, wherein the magnet coil system (A', A", A''') comprises active shielding.

8. The magnet arrangement (M", M''') of claim 1, wherein said further coil system (C", C''') generates a field in the working volume (V) which, when superposed with the field of the magnet coil system (A", A''') increases its inhomogeneity by a factor of at most 2.

9. The magnet arrangement (M, M', M", M''') of claim 1, wherein said further coil system (C, C', C", C''') or said magnet partial coil systems (A1, A1', A1", A1''', A2''', ..., An''') comprise coil bodies which consist of a material having a resistivity>1 E-9 ohm m at an operating temperature thereof.

10. The magnet arrangement (M, M', M", M''') of claim 1, wherein said first partial coil system (C1, C1', C1", C1''') or said second partial coil system (C2, C2', C2", C2''') comprise at least one coil which is normally conducting.

11. The magnet arrangement (M, M', M", M''') of claim 1, wherein said first partial coil system (C1, C1', C1", C1''') or said second partial coil system (C2, C2', C2", C2''') comprise at least one coil which is superconducting.

12. The magnet arrangement (M, M', M", M''') of claim 11, wherein said magnet coil system (A, A', A", A''') and said further coil system (C, C', C", C''') are disposed in a common container, said container being filled with cooling liquids and/or having a device for active cooling of said container.

13. The magnet arrangement (M, M', M", M''') of claim 11, wherein said magnet coil system (A, A', A", A''') and said further coil system (C, C', C", C''') are disposed in different containers, said containers being filled with cooling liquids and/or having a device for active cooling of the containers.

14. The magnet arrangement (M, M', M", M''') of claim 1, wherein the magnet arrangement is part of an apparatus for electron paramagnetic resonance (EPR) or for nuclear magnetic resonance (NMR).

15. A method for operating the magnet arrangement (M, M', M", M''') of claim 1, wherein at least one of the magnet partial coil systems (A1, A1', A1", A1''', A2''', ..., An''') generates a magnetic field of at least 1 T in the working volume (V) and wherein an overall magnetic field in the working volume (V) which is generated by said magnet partial coil systems (A1, A1', A1", A1''', A2''', ..., An''') and said further coil system (C, C', C", C''') is varied by changing a current which flows in said further coil system (C, C', C", C''').

* * * * *